(12) United States Patent
Wu et al.

(10) Patent No.: US 11,171,314 B2
(45) Date of Patent: Nov. 9, 2021

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Pohsien Wu, Beijing (CN); Yuhsiung Feng, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 53 days.

(21) Appl. No.: 16/611,632

(22) PCT Filed: May 10, 2019

(86) PCT No.: PCT/CN2019/086468
§ 371 (c)(1),
(2) Date: Nov. 7, 2019

(87) PCT Pub. No.: WO2019/233246
PCT Pub. Date: Dec. 12, 2019

(65) Prior Publication Data
US 2021/0028405 A1 Jan. 28, 2021

(30) Foreign Application Priority Data
Jun. 8, 2018 (CN) .......................... 201810588070.1

(51) Int. Cl.
*H01L 51/52* (2006.01)
*G02B 1/113* (2015.01)

(52) U.S. Cl.
CPC .......... *H01L 51/5281* (2013.01); *G02B 1/113* (2013.01)

(58) Field of Classification Search
CPC ............. H01L 51/5281; H01L 51/8265; H01L 51/5221; H01L 27/32; H01L 2251/55; G02B 1/113
(Continued)

(56) References Cited

U.S. PATENT DOCUMENTS

2009/0243477 A1* 10/2009 Saneto .................. B82Y 30/00
313/504
2012/0280612 A1* 11/2012 Lee ...................... H01L 51/5281
313/504
(Continued)

FOREIGN PATENT DOCUMENTS

CN 103875091 A 6/2014
CN 105098095 A 11/2015
(Continued)

OTHER PUBLICATIONS https://refractiveindex.info/?shelf=main&book=Yb&page=Larruquert.*
Chinese Office Action for corresponding Chinese Application No. 201810588070.1 dated Oct. 9, 2019.

*Primary Examiner* — Dao H Nguyen
(74) *Attorney, Agent, or Firm* — Arent Fox LLP; Michael Fainberg

(57) ABSTRACT

Disclosed are a display panel and a display device. The display panel includes a substrate, a first electrode layer located on the substrate, a light emitting layer located on the first electrode layer, a second electrode layer located on the light emitting layer, an optical film layer located on the second electrode layer and configured to improve color offset and extracting light and an anti-reflecting layer located between the second electrode layer and the optical film layer; and the refractive index of the anti-reflecting layer is
(Continued)

greater than that of the second electrode layer and is smaller than that of the optical film layer.

14 Claims, 4 Drawing Sheets

(58) Field of Classification Search
USPC .............. 257/667, 40, 43, 59, 89, E33.001, 257/E33.002, E33.004, E33.062, E27.111, 257/E29.003, E29.004; 313/504, 506, 313/112; 438/28, 29, 32, 104
See application file for complete search history.

(56) References Cited

U.S. PATENT DOCUMENTS

| | | |
|---|---|---|
| 2014/0264311 A1 | 9/2014 | Lang et al. |
| 2016/0133880 A1* | 5/2016 | Lee .................... H01L 51/5281 257/40 |
| 2017/0033318 A1 | 2/2017 | Wu et al. |

FOREIGN PATENT DOCUMENTS

| | | |
|---|---|---|
| CN | 105590948 A | 5/2016 |
| CN | 107068709 A | 8/2017 |
| CN | 108807479 A | 11/2018 |

* cited by examiner

DISPLAY PANEL AND DISPLAY DEVICE

CROSS-REFERENCE TO RELATED APPLICATION

The disclosure is a National Stage of International Application No. PCT/CN2019/086468, filed on May 10, 2019, which claims priority to Chinese Patent Application No. 201810588070.1, entitled "DISPLAY PANEL AND DISPLAY DEVICE", filed to Patent Office of the People's Republic of China on Jun. 8, 2018, both of which are incorporated herein by reference in their entireties.

FIELD

The disclosure relates to the technical field of display and in particular relates to a display panel and a display device.

BACKGROUND

Serving as a new-generation display technology, an organic light-emitting diode (OLED) device has the characteristics of self-illumination, wide viewing angle, short response time, high light-emitting efficiency, wide color range, low working voltage, thin panel and capability of producing a large-size flexible display so as to attract more attention.

SUMMARY

Some embodiments of the disclosure provide the display panel including a substrate, a first electrode layer located on the substrate, a light emitting layer located on the first electrode layer, a second electrode layer located on the light emitting layer, an optical film layer located on the second electrode layer and configured to improve color offset and extract light and an anti-reflecting layer located between the second electrode layer and the optical film layer; and the refractive index of the anti-reflecting layer is greater than that of the second electrode layer and is smaller than that of the optical film layer.

In a possible implementation, in the display panel provided by some embodiments of the disclosure, the refractive index of the anti-reflecting layer ranges from 0.5 to 1.

In a possible implementation, in the display panel provided by some embodiments of the disclosure, the absorption coefficient of the anti-reflecting layer is smaller than 3.

In a possible implementation, in the display panel provided by some embodiments of the disclosure, the thickness of the anti-reflecting layer is smaller than 20 nm.

In a possible implementation, in the display panel provided by some embodiments of the disclosure, the thickness of the anti-reflecting layer ranges from 5 nm to 10 nm.

In a possible implementation, in the display panel provided by some embodiments of the disclosure, the anti-reflecting layer is made of a metal or an alloy.

In a possible implementation, in the display panel provided by some embodiments of the disclosure, the anti-reflecting layer is made of one of calcium, lithium and gold or the anti-reflecting layer is made of an alloy composed of at least two of calcium, lithium and gold.

In a possible implementation, the first electrode layer is an anode layer; and the second electrode layer is a cathode layer.

In a possible implementation, the display panel provided by some embodiments of the disclosure further includes a reflecting layer located between the substrate and the first electrode layer.

Some embodiments of the disclosure further provide the display device including the display panel.

DETAILED DESCRIPTION OF THE EMBODIMENTS

In related technologies, all solutions of reducing the reflective index of an OLED device adopt a destructive interference principle by which the reflective index of the OLED device may be reduced to a certain extent, but the properties of the OLED device are greatly affected, for example, the light extraction efficiency of the OLED device is affected due to the damage of a microcavity structure of the OLED device in some solutions, and the reflective index is reduced in a multiple film layer stacking way in some solutions, so that the thickness of the OLED device is increased on one hand, the complexity of a production process is increased on the other hand, and furthermore, it is not easy to actually apply the OLED device to a product side.

For solving the problem that the reflective index may not be reduced under the condition that the properties of the OLED device are not obviously affected in the related art, some embodiments of the disclosure provide a display panel and a display device.

The embodiments of the display panel and the display device provided by some embodiments of the disclosure are described below in detail in combination with accompanying drawings. The thickness and shape of each film layer in the accompanying drawings do not reflect a true proportion, but only intend to schematically illustrate the content of the disclosure.

Figure 1:
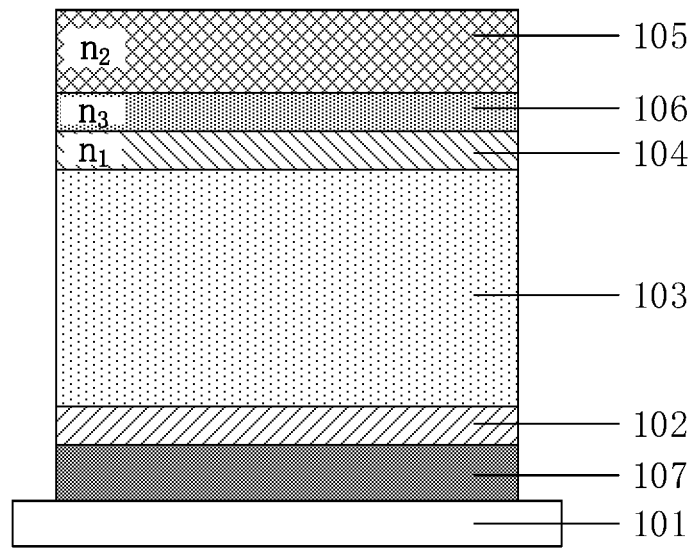
FIG. 1 is a structural schematic diagram of a display panel provided by some embodiments of the disclosure.

On one hand, some embodiments of the disclosure provide the display panel, as shown in FIG. 1, including a substrate 101, a first electrode layer 102 located on the substrate 101, a light emitting layer 103 located on the first electrode layer 102, a second electrode layer 104 located on the light emitting layer 103, an optical film layer 105 located on the second electrode layer 104 and configured to improve color offset and extracting light and an anti-reflecting layer 106 located between the second electrode layer 104 and the optical film layer 105.

The refractive index of the anti-reflecting layer 106 is greater than that of the second electrode layer 104 and is smaller than that of the optical film layer 105.

According to the display panel provided by some embodiments of the disclosure, the anti-reflecting layer is arranged between the second electrode layer and the optical film layer, and the refractive index of the anti-reflecting layer is greater than that of the second electrode layer and is smaller than that of the optical film layer, so that the refractive index difference of film layers is reduced, ambient light irradiating the display panel is not easy to totally reflect, furthermore, the reflective index of the display panel is reduced, and the display effect of the display panel is improved on the basis that other properties of the display panel are not affected. In addition, the production process of the display panel is also very simple.

Figure 2:
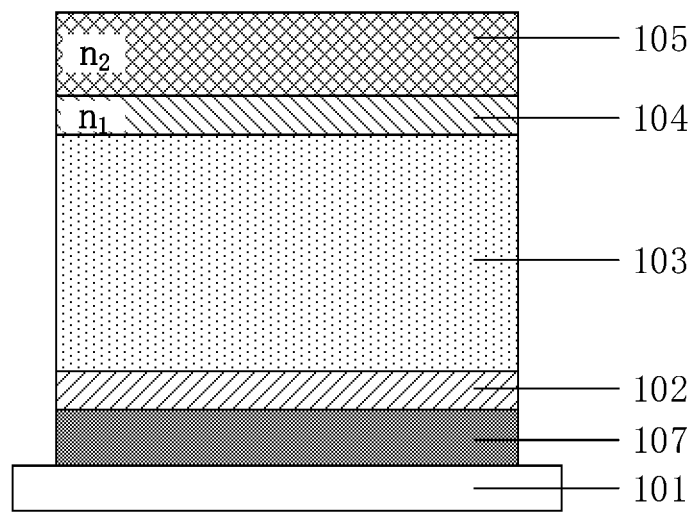
FIG. 2 is a structural schematic diagram of a display panel in the related art.

As an example, the first electrode layer 102 may be an anode layer; and the second electrode layer 104 may be a cathode layer. During specific implementation, the second electrode layer may be made of a semitransparent and semi-reflective metal material such as metallic silver, in other words, the main component of the second electrode layer is silver (Ag), the refractive index of silver is very small under visible wavelength and is about 0.1, and the optical film layer is generally made of an organic material, so that the refractive index of the optical film layer is generally greater than 1.7, and furthermore, the refractive index difference of the second electrode layer and the optical film layer is relatively large. In a structure of the display panel in correlated technologies, as shown in FIG. 2, the refractive index of the second electrode layer 104 is expressed by $n_1$, the refractive index of the optical film layer 105 is expressed by $n_2$, and the refractive index difference of the second electrode layer 104 and the optical film layer 105 serving as two interfaces is relatively large, so that total reflection is easy to happen, a light ray irradiates from a medium with a large refractive index (optically denser) to a medium with a small refractive index (optically thinner) when ambient light irradiates from the optical film layer 105 to the second electrode layer 104, furthermore, total reflection may happen when an incident angle is greater than a total reflection critical angle $C_1$, the reflection of the ambient light may seriously affect the display effect of the display panel, and the total reflection critical angle $$C_1 = \arcsin\frac{n_1}{n_2},$$

namely all light rays of which the incident angles are greater than $C_1$ may be totally reflected.

As shown in FIG. 1, in some embodiments of the disclosure, the anti-reflecting layer 106 is located between the second electrode layer 104 and the optical film layer 105, and the refractive index $n_3$ of the anti-reflecting layer 106 ranges from $n_1$ to $n_2$, namely $n_1<n_3<n_2$, so that the refractive index difference of the film layers is reduced, and it is not easy for the ambient light irradiating the display panel to totally reflect, optionally, when the light ray irradiates from the optical film layer 105 with a large refractive index to the anti-reflecting layer 106 with a small refractive index, total reflection may happen only when the incident angle is greater than a total reflection critical angle $C_2$, $$C_2 = \arcsin\frac{n_3}{n_2},$$

$n_3>n_1$, therefore, $C_2>C_1$, when the light ray irradiates from the anti-reflecting layer 106 with a large refractive index to the second electrode layer 104 with a small refractive index, total reflection may happen only when the incident angle is greater than a total reflection critical angle $C_3$, $$C_3 = \arcsin\frac{n_1}{n_3},$$

$n_3<n_2$, therefore, $C_3>C_1$, it is obvious that both the total reflection critical angle $C_2$ that the light ray irradiates from the optical film layer 105 to the anti-reflecting layer 106 and the total reflection critical angle $C_3$ that the light ray irradiates from the anti-reflecting layer 106 to the second electrode layer 104 are greater than $C_1$, thus, only the light ray with the larger incident angle may be totally reflected, so that total reflection among the film layers is not easy to happen, furthermore, the reflective index of the display panel is reduced, and the display effect is improved.

Optionally, in the display panel provided by some embodiments of the disclosure, the refractive index of the anti-reflecting layer ranges from 0.5 to 1.

Known by analysis as above, the larger the refractive index difference of the film layers is, the more easily the total reflection happens, and therefore, the refractive index of the anti-reflecting layer may not to be too large or too small; if the refractive index of the anti-reflecting layer is very small, the refractive index difference between the optical film layer and the anti-reflecting layer is still very large, and it is easy for the light ray irradiating from the optical film layer to the anti-reflecting layer to totally reflect; if the refractive index of the anti-reflecting layer is very large, the refractive index difference between the anti-reflecting layer and the second electrode layer is still very large, and it is easy for the light ray irradiating from the anti-reflecting layer to the second electrode layer to totally reflect; and therefore, total reflection is not easy to happen between the optical film layer and the anti-reflecting layer and between the anti-reflecting layer and the second electrode layer by selecting a material of which the refractive index ranges from 0.5 to 1 to prepare the anti-reflecting layer, so that the reflective index of the display panel may be reduced.

Further, in the display panel provided by some embodiments of the disclosure, the absorption coefficient of the anti-reflecting layer is smaller than 3. In order to prevent the anti-reflecting layer from affecting the light ray emitted by the display panel for displaying the picture, the anti-reflecting layer is required to be produced by adopting a material with a relatively small absorption coefficient, the absorption coefficient K of the anti-reflecting layer may be selected to be smaller than 3, and a material of which the absorption coefficient is about 2.5 may be selected during specific implementation.

In an actual application, in the display panel provided by some embodiments of the disclosure, the thickness of the anti-reflecting layer is smaller than 20 nm. In order to avoid affecting the light transmittance of the display panel, the thickness of the anti-reflecting layer may not be too large and may be selected to be smaller than 20 nm, so that the optical properties of the display panel may not be affected. In addition, in order to guarantee the anti-reflecting properties of the anti-reflecting layer, the thickness of the anti-reflecting layer may not to be too small, the thickness of the anti-reflecting layer may be selected to range from 5 nm to 10 nm and may be 5 nm, 6 nm and the like, and the specific thickness of the anti-reflecting layer is not limited herein.

Optionally, in the display panel provided by some embodiments of the disclosure, the anti-reflecting layer may be made of a metal or an alloy. If the anti-reflecting layer is made of the metal or the alloy, on one hand, the requirement for the refractive index may be met, on the other hand, the anti-reflecting layer may have a certain reflecting property, so that a microcavity structure may be formed in the display panel, and furthermore, the light emitting efficiency and the purity of emergent light are improved. During specific implementation, other materials may also be adopted if only the requirement for the refractive index may be met, and the material of the anti-reflecting layer is not limited herein.

In the display panel provided by some embodiments of the disclosure, the anti-reflecting layer may be made of one of calcium, lithium and gold or an alloy composed of at least two of calcium, lithium and gold. In other words, the anti-reflecting layer may be made of calcium, lithium or gold or an alloy composed of two or three of calcium, lithium and gold, in addition, other materials may also be adopted, and there are no limits herein. During specific implementation, an anti-reflecting layer may be formed on the second electrode layer in an evaporation way, which is only illustrated with an example herein, but a production process of the anti-reflecting layer is not limited.

During specific implementation, the display panel provided by some embodiments of the disclosure, as shown in FIG. 1, further includes a reflecting layer 107 located between the substrate 101 and the first electrode layer 102.

A light ray irradiating from the light emitting layer 103 to one side of the substrate 101 may be reflected by arranging the reflecting layer 107 at the side, close to the substrate 101, of the first electrode layer 102, so that the light extraction efficiency of the display panel is increased. In addition, a microcavity structure is formed between the reflecting layer 107 and the second electrode layer 104, and the length of a microcavity is regulated by regulating the distance from the reflecting layer 107 to the second electrode layer 104, so that the purity of emergent light of the display panel is regulated, and the color range of the display panel is widened.

The fact that the optical properties of the display panel may not be affected by arranging the anti-reflecting layer is described by taking the anti-reflecting layer which has the refractive index $n_3$ equal to 0.7, the absorption coefficient K equal to 2.5 and the thickness D equal to 6 nm and is made of Ca as an example in combination with accompanying drawings.

Figure 3A:
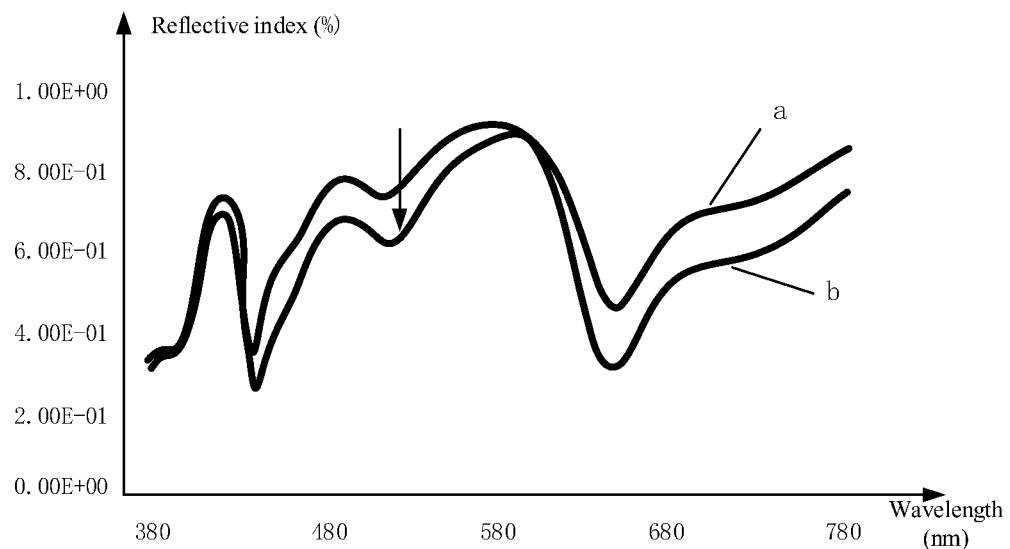
FIG. 3a to FIG. 3c are contrast schematic diagrams of reflective indexes of a structure provided with an anti-reflecting layer and a structure not provided with the anti-reflecting layer.
Figure 3B:
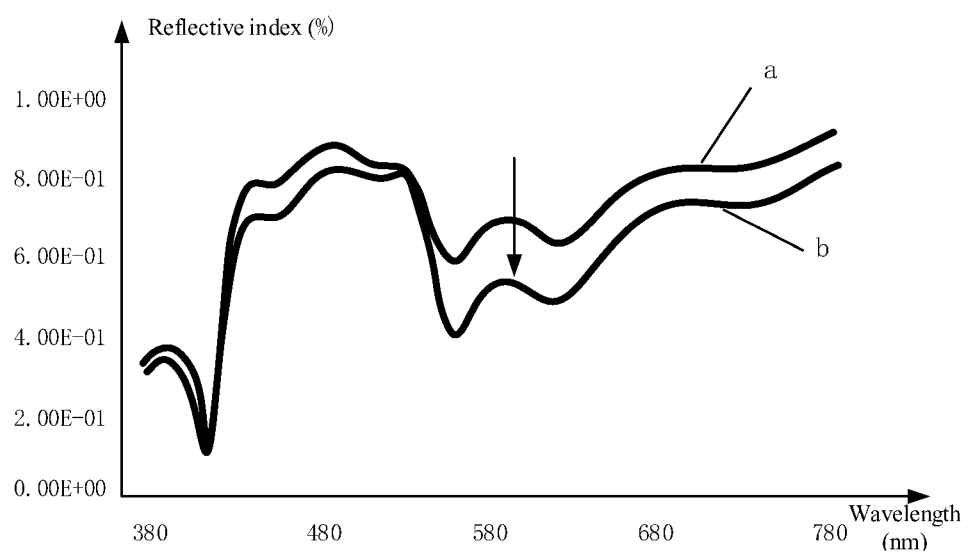
Figure 3C:
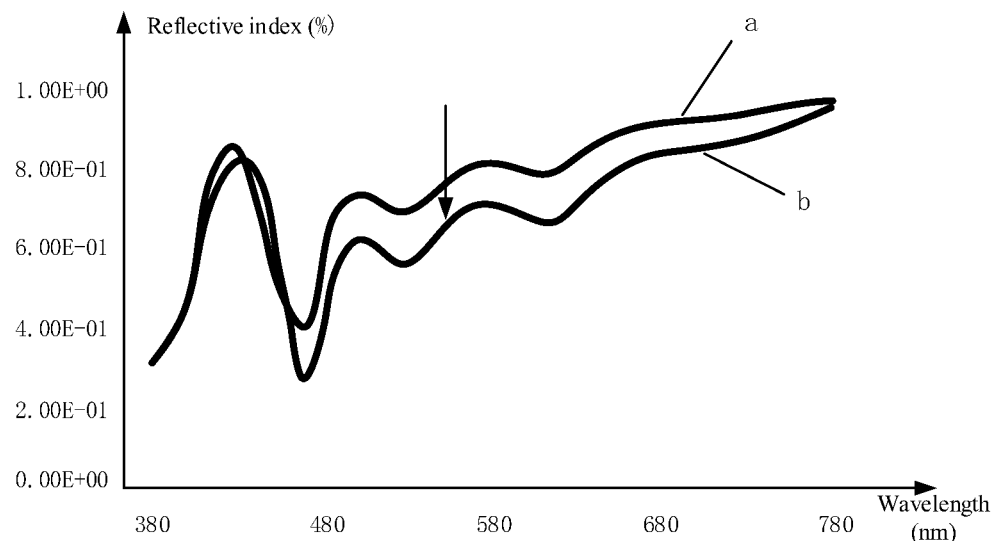

FIG. 3a to FIG. 3c are contrast schematic diagrams of reflective indexes of a structure provided with an anti-reflecting layer and a structure not provided with the anti-reflecting layer, wherein FIG. 3a shows the contrast schematic diagram of the reflective index of a red sub-pixel, FIG. 3b shows the contrast schematic diagram of the reflective index of a green sub-pixel, and FIG. 3c shows the contrast schematic diagram of the reflective index of a blue sub-pixel; in the figures, a horizontal coordinate shows reflected light wavelength, a vertical coordinate shows a reflective index, a curve a shows a reflective index of a display panel not provided with the anti-reflecting layer, and a curve b shows a reflective index of a display panel provided with the anti-reflecting layer; and seen from FIG. 3a to FIG. 3c, for the pixels with any colors, the reflective index of the display panel may be reduced (arrows in FIG. 3a to FIG. 3c show the reduction of the reflective index) and is generally reduced by 10%-20% due to the arrangement of the anti-reflecting layer.

Figure 4A:
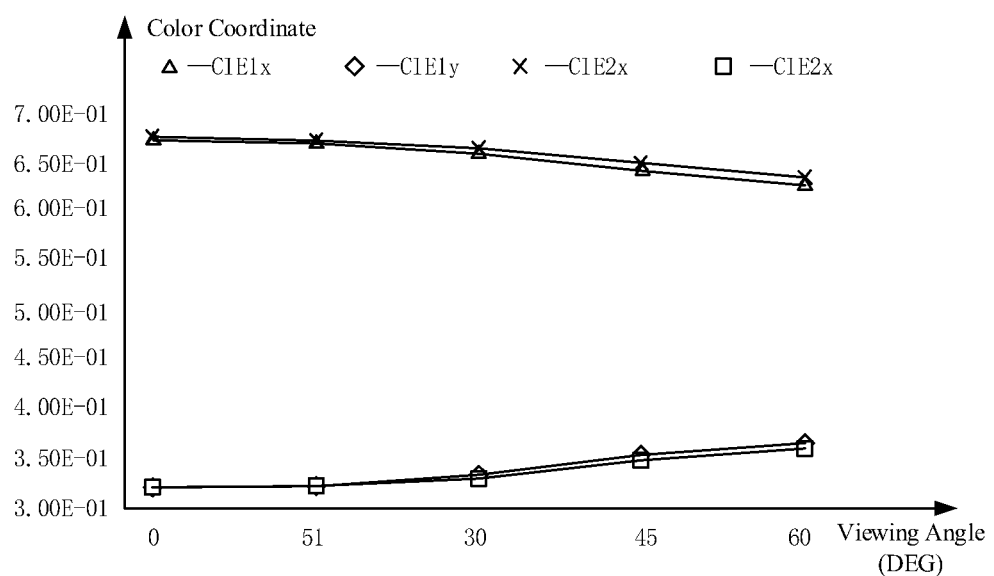
FIG. 4a to FIG. 4c are schematic diagrams of color offset degrees of the structure provided with the anti-reflecting layer and the structure not provided with the anti-reflecting layer under different viewing angles.
Figure 4B:
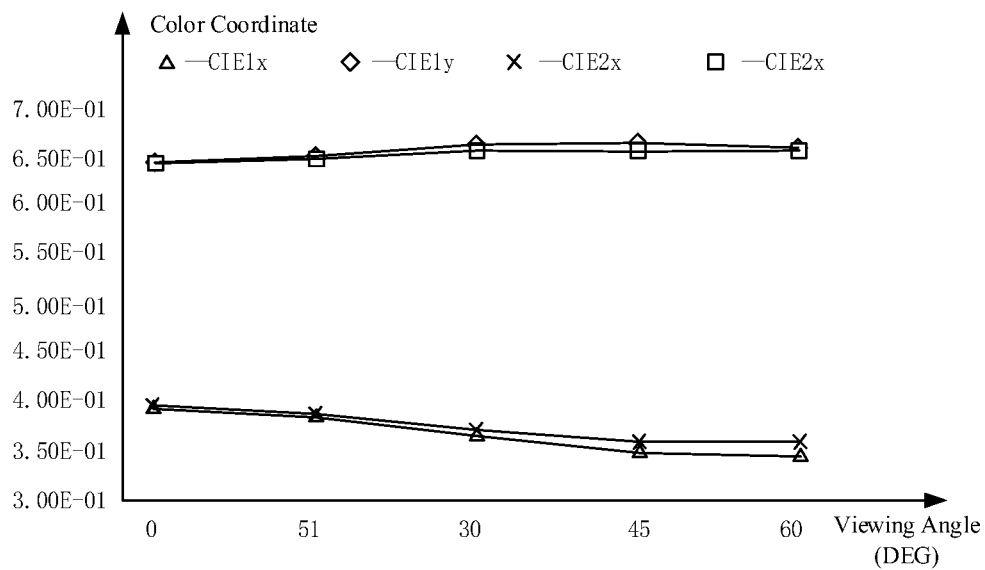
Figure 4C:
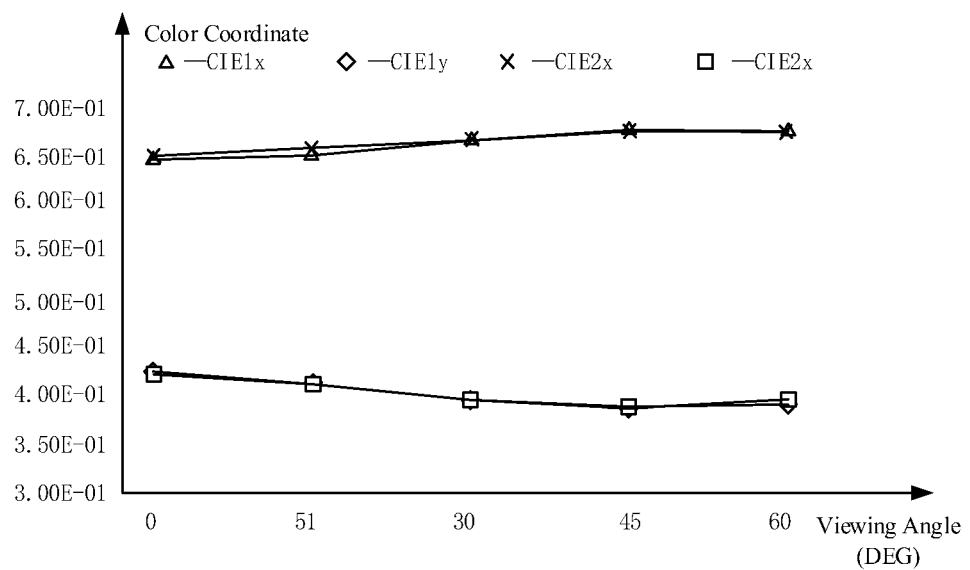

FIG. 4a to FIG. 4c are schematic diagrams of color offset degrees of the structure provided with the anti-reflecting layer and the structure not provided with the anti-reflecting layer under different viewing angles, wherein FIG. 4a shows the schematic diagram of the color offset degree of the red sub-pixel, FIG. 4b shows the schematic diagram of the color offset degree of the green sub-pixel, and FIG. 4c shows the schematic diagram of the color offset degree of the blue sub-pixel; in the figures, a horizontal coordinate shows a viewing angle, a vertical coordinate shows a color coordinate, a curve composted of "□" shows an x component of the color coordinate of the structure provided with the anti-reflecting layer, a curve composed of "□" shows a y component of the color coordinate of the structure provided with the anti-reflecting layer, a curve composed of "x" shows an x component of the color coordinate of the structure not provided with the anti-reflecting layer, a curve composed of "□" shows a y component of the color coordinate of the structure not provided with the anti-reflecting layer, known from FIG. 4a to FIG. 4c, the difference of the color coordinates of the structure provided with the anti-reflecting layer and the structure not provided with the anti-reflecting layer is very small, with FIG. 4a as an example, the curve composed of "□" and the curve composed of "x" in the figure are almost superposed, the curve composed of "□" and the curve composed of "□" are almost superposed, namely, the arrangement of the anti-reflecting layer hardly generates any influences to the color coordinate of the display panel, and the color offset degree of the display panel may not be affected. In addition, the anti-reflecting layer is generally made of the metal or the alloy and is adjacent to the second electrode layer, the arrangement of the anti-reflecting layer is equivalent to the increment of the thickness of the second electrode layer, and the thickening of the second electrode layer may result in the increment of the color offset degree in principle, however, seen from FIG. 4a to FIG. 4c, the arrangement of the anti-reflecting layer does not result in the increment of the color offset degree, and the reason that the color offset degree is basically unchanged may be that the anti-reflecting layer is capable of relieving the color offset degree of the display panel to a certain extent.

Table 1 is a brightness contrast table of the structure provided with the anti-reflecting layer and the structure not provided with the anti-reflecting layer, seen from the table, for the sub-pixels with different colors, the difference of the brightness of the structure provided with the anti-reflecting layer and the brightness of the structure not provided with the anti-reflecting layer is not great, optionally, after the anti-reflecting layer is arranged, the brightness of the red sub-pixel and the brightness of the green sub-pixel are slightly increased, the brightness of the blue sub-pixel is slightly reduced, the brightness of the display panel is slightly increased, but is not greatly changed on the whole, and therefore, it may be proved that the light emitting brightness of the light emitting layer may not be reduced and the display brightness may be increased to a certain extent due to the arrangement of the anti-reflecting layer.

TABLE 1

Brightness Contrast Table of Structure Provided with Anti-reflecting Layer and Structure Not Provided with Anti-reflecting Layer

|  | Brightness of Structure Not Provided with Anti-reflecting Layer (nits) | Brightness of Structure Provided with Anti-reflecting Layer (nits) |
| --- | --- | --- |
| Red(R) | 2961 | 3024 |
| Green(G) | 10612 | 10800 |
| Blue(B) | 679 | 664 |

On the second aspect, according to the same inventive idea, some embodiments of the disclosure provide a display device including the display panel, the display device may be applied to any product or part with a display function, such as a mobile phone, a tablet personal computer, a television, a display, a notebook computer, a digital photo frame and a navigating instrument. The problem solving principle of the display device is similar to that of the display panel, and therefore, the implementation of the display device may refer to that of the display panel, and the descriptions thereof are omitted herein.

According to the display panel and the display device which are provided by some embodiments of the disclosure, the anti-reflecting layer is arranged between the second electrode layer and the optical film layer, and the refractive index of the anti-reflecting layer is greater than that of the second electrode layer and is smaller than that of the optical film layer, so that the refractive index difference of the film layers is reduced, ambient light irradiating the display panel is not easy to totally reflect, furthermore, the reflective index of the display panel is reduced, and the display effect of the display panel is improved on the basis that other properties of the display panel are not affected. In addition, both the absorption coefficient and thickness of the anti-reflecting layer are relatively small, so that the optical properties and light extraction efficiency of the display panel may not be affected.

Obviously, various alterations and modifications on the disclosure may be made by those skilled in the art without departing from the spirit and scope of the disclosure. Thus, the disclosure also intends to include the alternations and modifications if the alternations and modifications on the disclosure fall into the scopes of claims and equivalent technologies of the disclosure.

The invention claimed is:

1. A display panel, comprising a substrate, a first electrode layer located on the substrate, a light emitting layer located on the first electrode layer, a second electrode layer located on the light emitting layer, an optical film layer located on the second electrode layer and configured to improve color offset and extract light and an anti-reflecting layer located between the second electrode layer and the optical film layer; and
   a refractive index of the anti-reflecting layer is greater than that of the second electrode layer and is smaller than that of the optical film layer;
   wherein the thickness of the anti-reflecting layer ranges from 5 nm to 10 nm;
   wherein the anti-reflecting layer is made of one of calcium, lithium and gold, or the anti-reflecting layer is made of an alloy composed of at least two of calcium, lithium and gold.

2. The display panel according to claim 1, wherein the refractive index of the anti-reflecting layer ranges from 0.5 to 1.

3. The display panel according to claim 1, wherein an absorption coefficient of the anti-reflecting layer is smaller than 3.

4. The display panel according to claim 1, wherein a thickness of the anti-reflecting layer is smaller than 20 nm.

5. The display panel according to claim 1, wherein the anti-reflecting layer is made of a metal or an alloy.

6. The display panel according to claim 1, wherein the first electrode layer is an anode layer; and the second electrode layer is a cathode layer.

7. The display panel according to claim 6, further comprising a reflecting layer located between the substrate and the first electrode layer.

8. A display device, comprising the display panel according to claim 1.

9. The display device according to claim 8, wherein the refractive index of the anti-reflecting layer ranges from 0.5 to 1.

10. The display device according to claim 8, wherein an absorption coefficient of the anti-reflecting layer is smaller than 3.

11. The display device according to claim 8, wherein a thickness of the anti-reflecting layer is smaller than 20 nm.

12. The display device according to claim 8, wherein the anti-reflecting layer is made of a metal or an alloy.

13. The display device according to claim 8, wherein the first electrode layer is an anode layer; and the second electrode layer is a cathode layer.

14. The display device according to claim 13, wherein the display panel further comprises a reflecting layer located between the substrate and the first electrode layer.

* * * * *